March 3, 1959 D. Q. FULLER 2,876,401

SEMI-CONDUCTOR DEVICES

Filed Sept. 7, 1956

Inventor
Dennis Q. Fuller
By
Holcomb, Wetherill & Brisebois
Attorneys

United States Patent Office 2,876,401

Patented Mar. 3, 1959

2,876,401

SEMI-CONDUCTOR DEVICES

Dennis Quintrell Fuller, Cambridge, England, assignor to Pye Limited, Cambridge, England, a British company Application September 7, 1956, Serial No. 608,566

Claims priority, application Great Britain September 12, 1955

8 Claims. (Cl. 317—235)

The present invention relates to semi-conductor devices, such as, transistors and crystal diodes.

It is an object of this invention top rovide a simple construction of semi-conductor device in which efficient dissipation of the heat generated in the device, when in operation, is obtained.

The present invention consists in a semi-conductor device comprising a wafer (as hereinafter defined) of semi-conductor material sandwiched between two plate-like contact members which are respectively in electrical contact with the opposite surfaces of the wafer, either directly or through an electrode connected to the surface, and one or more sealing members surrounding the wafer to form a hermetically sealed casing around the wafer of semi-conductor material.

Throughout this specification it is to be understood that the term "wafer" as applied to a member of semi-conductor material means a thin slice or sheet-like piece of the material, having two opposite surfaces to which electrical contact may be made.

Preferably, each plate-like contact member consists of a metal plate or disc and may be provided with a tag portion to which external connections to the wafer or electrodes connected to the surface thereof may be joined.

The wafer or semi-conductor material is preferably mounted on an apertured support which may have an electrically conducting surface in contact with the wafer, said surface forming a connection to the wafer, such as the base connection when the device comprises a transistor. The emitter and collector electrodes are then arranged on opposite sides of the wafer on the portion of semi-conductor material extending over the aperture. The support forming the base connection of the transistor conveniently comprises an apertured metal disc also provided with a tag to which an external connection may be made.

According to a feature of the invention, the contact members comprise metal plates of similar shape to the support member carrying the wafer of semi-conductor material and the sealing means comprises one or more members of insulating material sealed between the peripheral edges of the metal plate members, or between each plate member and the adjacent surface of the support member whereby the support member is mounted between the plate members and its edges are sandwiched between the sealing members.

The support for the semi-conductor material and the metal contact members may be of disc-like form and the sealing members constitute silvered glass or ceramic rings of appropriate dimensions positioned one on each side of the base member in contact therewith and with the inner surface of one of the metal contact members. Sealing of the silvered rings in position is effected by applying heat to the peripheral edges of the metal contact members. The electrodes on the wafer or semi-conductor material may also be electrically connected to their respective metal contact members by applying heat to the appropriate portion of the metal plate members.

In order that the invention may be more fully understood, reference will now be made to the accompanying drawings in which.

Figure 1:
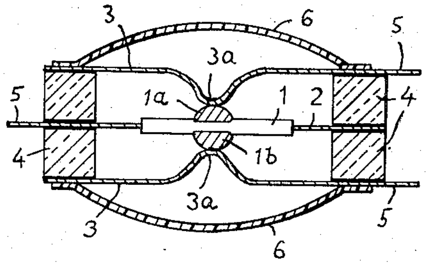
Figure 1 is a diagrammatic transverse section of a transistor constructed according to the invention.
Figure 2:
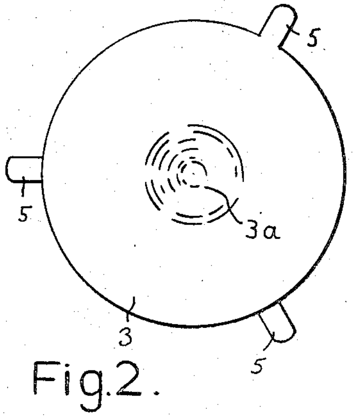
Figure 2 is a plan view of the device in Figure 1, with the cover removed.

Referring to the drawings, and in particular to Figures 1 and 2, a transistor comprises a wafer 1 of semi-conductor material, such as germanium, mounted on an apertured metal disc 2 and formed with an emitter electrode 1*a* and a collector electrode 1*b* respectively, on opposite sides of the wafer 1 in the area thereof extending over the aperture of the disc. The disc 2 forms the base electrode of the transistor. The emitter and collector electrodes may comprise indium beads alloyed to the germanium wafer. On each side of the disc supporting the germanium wafer is arranged a plate-like contact member in the form of a metal disc 3 of similar size to the apertured disc 2, and provided with a dished or indented central portion 3*a* which is aranged to contact the emitter and collector electrodes 1*a*, 1*b* respectively. The discs 2 and 3 are made of Kovar or another metal having a similar coefficient of expansion to glass.

Silvered glass rings 4 are arranged between each surface of the disc 2 and the adjacent metal plate 3, and heat is applied to the peripheral edges of the metal plates in order to seal the silvered glass rings to the adojining metal surfaces and thereby form a hermetically sealed casing around the wafer of semi-conductor material. The electrical connection between the emitter and collector electrodes 1*a*, and 1*b* and the adjacent metal plates may also be formed by applying heat to the dished or indented area 3*a* of each metal plate.

Each of the metal plates 3 and the apertured disc 2 is formed with a radially projecting tag member 5 to which an external connecting wire may be soldered.

If desired, in order to protect the transistor thus formed from mechanical shocks, an outer casing of a resilient insulating material, such as a synthetic resin material, may be formed so as to cover at least part of the outer surface of the transistor. For example the outer casing may take the form of a domed cover 6 secured over each metal plate.

Figure 3:
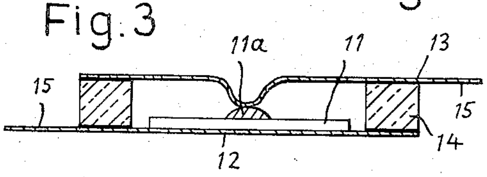
Figures 3, 4 and 5 are respectively diagrammatic transverse sections through three other forms of semi-conductor device constructed according to the invention.

Figure 3 shows a crystal diode constructed according to the invention, comprising a wafer of semi-conductor material 11 which has one surface in direct contact with a plate-like contact member 12 and is soldered thereto. The other surface carries an electrode 11*a* which is in contact with a plate-like contact member 13 in the form of a disc. A glass or ceramic sealing ring 14 is positioned between the members 12 and 13 and hermetically sealed thereto. Connections may be joined to tags 15 or on members 12 and 13.

Figure 4:
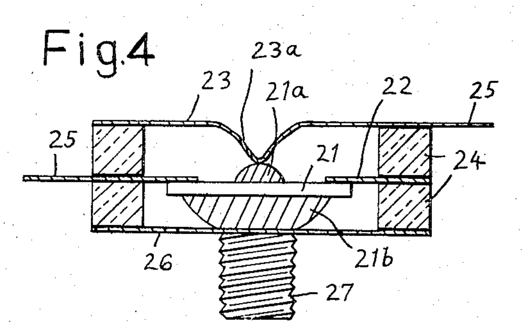

Figure 4 shows a further construction of transistor generally similar to that shown in Figures 1 and 2, and comprising a wafer of semi-conductor material 21 carrying an emitter electrode 21*a* and a collector electrode 21*b* respectively on opposite surfaces and mounted on an apertured metal disc 22 forming the base electrode. The contact member 23 comprises a metal disc having a dished portion 23*a* in contact with the emmiter 21*a*. The collector 21*b* contacts a metal contact member 26 provided with a threaded stud 27 by means of which the device may be conveniently mounted on a support, preferably in close contact therewith so as to assist in the conduction of heat away from the device. The sealing members comprise ceramic rings 24 coated with metal where they are to be sealed to other parts. Connecting tags 25 are also formed on disc 22 and member 23.

Figure 5:
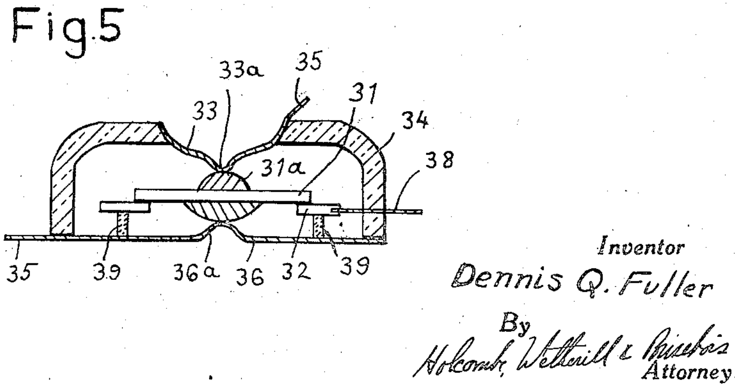

Finally Figure 5 shows a construction of transistor in which the wafer of semi-conductor material 31 formed with emitter and collector electrodes 31*a* and 31*b* is mounted on an apertured metal support 32 carried from a disc shaped contact member 36 by insulating spacers 39. The indented central portion 36*a* of contact member 36 is connected to collector electrode 31*b*. Emitter electrode 31*a* is connected to the indented centre portion 33*a* of a disc shaped contact member 33 which is connected to a surrounding glass insulating portion which may be formed integrally with the member 33. The free edge of the glass insulator is sealed to the contact member 36 thereby hermetically enclosing the wafer. A connecting pin 38 for making an external connection is sealed through the wall of the insulator 34 to be connected to the support 32 which forms the base electrode of the transistor. Connecting tags 35 are provided on the members 33 and 36.

It will be seen that a semi-conductor device constructed according to the present invention provides efficient heat dissipation away from the electrodes mounted on the semi-conductor wafer by reason of the large metal contact members in direct contact with the electrodes.

Whilst particular embodiments have been described, it will be understood that various modifications may be made without departing from the scope of this invention. For example the apertured support member for the germanium wafer and the plate-like contact members may be of other than circular form.

I claim:

1. A transistor device comprising a wafer of semiconducting material, an electrode on each of the opposite faces of said wafer and in electrical contact therewith, an apertured support member carrying and surrounding said wafer and in electrical contact therewith, a plate-like contact member in electrical contact with each of said electrodes and extending outwardly to be in spaced relationship with and on opposite sides of said support member, and a sealing member in hermetically sealing relationship between each of said contact members and said support member.

2. A transistor device comprising a wafer of semiconducting material, an electrode on each of the opposite faces of said wafer and in electrical contact therewith, an apertured support member carrying and surrounding said wafer and an electrically conducting surface on said support member in electrical contact with said wafer, a plate-like contact member in electrical contact with each of said electrodes and extending outwardly to be in spaced relationship with and on opposite sides of said support member, and a sealing member in hermetically sealing relationship between each of said contact members and said support member.

3. A transistor device comprising a wafer of semiconducting material, an electrode on each of the opposite faces of said wafer and in electrical contact therewith, an apertured support member carrying and surrounding said wafer and in electrical contact therewith, a plate-like contact member in electrical contact with each of said electrodes and extending outwardly to be in spaced relationship with and on opposite sides of said support member, and a sealing member of insulating material in hermetically sealing relationship between each of said contact members and said support member.

4. A transistor device comprising a wafer of semiconducting material, an electrode on each of the opposite faces of said wafer and in electrical contact therewith, an apertured metal support member carrying and surrounding said wafer and in electrical contact therewith, a plate-like metal contact member in electrical contact with each of said electrodes and extending outwardly to be in spaced relationship with and on opposite sides of said support member, a sealing member in hermetically sealing relationship between each of said contact members and said support member, and a connection tag on each of said contact members and said support member.

5. A transistor device comprising a wafer of semiconducting material, an electrode on each of the opposite faces of said wafer and in electrical contact therewith, an apertured support member carrying and surrounding said wafer and in electrical contact therewith a plate-like contact member having a dished portion in electrical contact with each of said electrodes and extending outwardly to be in spaced relationship with and on opposite sides of said support member, and a sealing member in hermetically sealing relationship between each of said contact members and said support member.

6. A transistor device comprising a wafer of semi-conducting material, an electrode on each of the opposite faces of said wafer and in electrical contact therewith, an apertured support member carrying and surrounding said wafer and in electrical contact therewith, a plate-like contact member in electrical contact with each of said electrodes and extending outwardly to be in spaced relationship with said support member a sealing member in hermetically sealing relationship between each of said contact members and said support member, and a threaded screw member formed with and to project outwardly from one of said contact members.

7. A transistor device comprising a wafer of semiconducting material, an electrode on each of the opposite faces of said wafer and in electrical contact therewith, an apertured support member carrying and surrounding said wafer and in electrical contact therewith, a plate-like contact member in electrical contact with each of said electrodes and extending outwardly to be in spaced relationship with and on opposite sides of said support member, a sealing member in hermetically sealing relationship between each of said contact members and said support member, and an outer casing of insulating material covering over said contact members but spaced therefrom at least over the major area thereof.

8. A transistor device comprising a wafer of semiconducting material, an electrode on each of the opposite faces of said wafer and in electrical contact therewith, an apertured support member carrying and surrounding said wafer and in electrical contact therewith, a plate-like contact member in electrical contact with each of said electrodes and extending outwardly to be in spaced relationship with and on opposite sides of said support member, a sealing member in hermetically sealing relationship between each of said contact members and said support member, a connection tag on each of said contact members and said support member, and an outer casing of insulating material covering over said contact members but spaced therefrom except at the peripheral edges thereof.

References Cited in the file of this patent

UNITED STATES PATENTS

| | | |
|---|---|---|
| 2,751,528 | Burton | June 19, 1956 |
| 2,756,374 | Colleran et al. | July 24, 1956 |
| 2,759,133 | Mueller | Aug. 14, 1956 |